US006732006B2

(12) United States Patent
Haanstra et al.

(10) Patent No.: US 6,732,006 B2
(45) Date of Patent: May 4, 2004

(54) METHOD AND SYSTEM TO PROCESS SEMICONDUCTOR WAFERS

(75) Inventors: Kornelius Haanstra, Nijeveen (NL); Marinus Jan Jan Van Der Pol, Tiel (NL); Jan Zinger, Dwingelo (NL)

(73) Assignee: ASM International NV (NL)

( * ) Notice: Subject to any disclaimer, the term of this patent is extended or adjusted under 35 U.S.C. 154(b) by 0 days.

(21) Appl. No.: 10/071,761

(22) Filed: Feb. 6, 2002

(65) Prior Publication Data

US 2003/0149506 A1 Aug. 7, 2003

(51) Int. Cl.[7] .............................................. G06F 19/00
(52) U.S. Cl. .................... 700/121; 700/95; 700/103; 700/110
(58) Field of Search ................................. 700/108, 121, 700/95, 90, 117, 28, 103, 110; 702/187

(56) References Cited

U.S. PATENT DOCUMENTS

| 5,661,669 A | * | 8/1997 | Mozumder et al. ........... 702/84 |
| 5,897,710 A | * | 4/1999 | Sato et al. ..................... 427/8 |
| 6,162,010 A | * | 12/2000 | Ishizawa et al. ............ 414/805 |
| 6,535,769 B1 | * | 3/2003 | Konar ........................ 700/14 |

FOREIGN PATENT DOCUMENTS

WO WO 01/18623 A1 * 3/2001

* cited by examiner

Primary Examiner—Jayprakash N. Gandhi
(74) Attorney, Agent, or Firm—Alexander B. Ching; Squire, Sanders & Dempsey L.L.P.

(57) ABSTRACT

A method and system for the processing of one or more wafers in a process tool is provided, the method comprising subjecting the one or more wafer in a reaction chamber to a process, generating an inhibit next load flag on predefined conditions, the inhibit next load flag not effecting already started processing of a wafer. Prior to the start of the processing of a wafer, a check is performed to see if an inhibit next load flag has been set. When upon checking it has been found that an inhibit next load has been set, the start of the process in the reaction chamber is prohibited. The method further includes providing pre-programmed recovery procedures, such that after execution of a pre-programmed recovery procedure the to be processed wafer of which the start of the processing is prohibited ends in a defined state such that the tool can be used for further processing.

79 Claims, 12 Drawing Sheets

METHOD AND SYSTEM TO PROCESS SEMICONDUCTOR WAFERS

TECHNICAL FIELD

This invention relates to the field of semiconductor manufacturing and more specifically to a method and system to process semiconductor wafers, to interrupt this processing if an alarm condition exists and to recover the situation after an interruption has taken place.

BACKGROUND OF THE INVENTION

In automated fabrication plants or inside a complex wafer-processing tool, work pieces travel from one process station to another. At these process stations various operations are performed on the work pieces. During processing certain events may occur that will require the system to shutdown or at the very least temporarily pause processing. These may include problems in a process station detected by examining the output of the process station or by detection of out of specification parameters in a system, among other problems. When this occurs, it is necessary to halt the processing of wafers in the system to prevent further damage. However, when the processing is halted, wafers of which the processing is halted may still be present in the system. These wafers block the continuation of further processing in the system after the alarm condition has been resolved. After resolving of the alarm condition that resulted in interruption of the process, the further processing or handling of these wafers of which the processing was interrupted needs to be defined before the system can be used for continued processing. Therefore, there is a need for a way to monitor for and handle conditions that require the interruption of processing in a process tool and, after interruption, the recovery of the system and continuation of further processing.

Part of this problem is addressed in U.S. Pat. No. 6,162,010 issued to Ishizawa et al. and entitled "Method of Recovering Object to be Treated After Interruption". This patent discusses the recovery of a semiconductor wafer after a treatment is unexpectedly stopped for a reason such a loss of power to the processing machinery. This patent discloses recovering wafers to an original cassette if the wafers are cooled and allowing the wafers to cool if the wafers were in a reactor-processing chamber. This method suffers from several drawbacks. First, it is drawn to a single wafer processing system and is not easily adaptable to batch processing. Second the recovery method is rigid and does not allow for override by operator or temporary suspension.

International Publication WO 01/18623 A1 entitled "Real-Time Fault Detection" discloses a method for detecting faults in semiconductor wafers in a real time environment. In this disclosure, a method and system for determining if there are faults within a system is disclosed. If a fault in the manufacturing system exists, that information is sent to an interface that could shut down the process or provide information to an operator. Drawbacks to this invention include its lack of ability to override a fault detection or to handle a fault detection in a variety of ways.

Another approach is disclosed in U.S. Pat. No. 5,897,710 issued to Sato et al. entitled "Substrate Processing Apparatus and Substrate Processing Method". In the invention of Sato et al, an inspection station is included with a processing system. The inspection station is able to inspect the wafers. When wafers fail inspection, further processing can be interrupted immediately.

A disadvantage of the methods described above is that the action of immediate interruption of a process might in itself create damage because the work pieces concerned receive only a partial treatment. It is questionable if completion of the treatment in a later stage will result in the desired end effect, without complications and negative side effects.

It is the objective of the present invention to provide in a system an method to deal with an alarm condition in a way that prevents the necessity of immediate process interruption and its disadvantages and to provide in pre-programmed, operator selectable recovery procedures after interruption has taken place.

SUMMARY OF THE INVENTION

The object of the invention is achieved by providing an alarm level that allows continuing already started processing but prevents the start of processing of next batches.

In one embodiment, a method and system for processing one ore more wafers in a process tool is provided including subjecting the one or more wafer in a reaction chamber to a process. The method includes generating an inhibit next load flag (INL flag) on predefined conditions, the inhibit next load flag not effecting already started processing of a wafer. Prior to the start of the processing of a wafer, a check is performed to see if an inhibit next load flag has been set. When upon checking it has been found that an inhibit next load has been set, the start of the process is prohibited. The method further includes providing pre-programmed recovery procedures, such that after execution of a pre-programmed recovery procedure the to be processed wafer of which the start of the processing is prohibited ends in a defined state such that the tool can be used for further processing. In another embodiment, a method and system for the batch-wise processing of wafers in a process tool is provided including subjecting the wafers batch-wise to a process in a reaction chamber. The method includes generating an inhibit next load flag on predefined conditions, the inhibit next load flag not effecting already started processing of a wafer batch. Prior to the start of the processing of a wafer batch, a check is performed to see if an inhibit next load flag has been set. When upon checking it has been found that an inhibit next load has been set, the start of the process of the wafer batch in the reaction chamber is prohibited. The method further includes providing pre-programmed recovery procedures, such that after execution of a pre-programmed recovery procedure the to be processed wafer batch of which the start of the processing is prohibited ends in a defined state such that the tool can be used for further processing.

In yet another embodiment, a method and system for processing one ore more wafers in a process tool is provided including subjecting the one or more wafer in a reaction chamber to a process. The method includes setting as a default a confirmation flag in a "false" state, and examining in a wafer inspection tool a wafer previously processed in said reaction chamber and comparing the results against acceptance criteria and setting the confirmation flag in a "true" state when said results are within the acceptance criteria. The start of the processing in the reaction chamber is only allowed when the confirmation flag is in a "true" state.

Technical benefits of the present invention include that immediate interruption of an already started process is prevented as much as possible. Although immediate interruption still remains available as an option and might be used when sudden severe problems occur, like power failure, in many cases alarm conditions indicate a potential problem that needs attention. Without paying attention, such a condition might develop into a more severe problem. According to the invention the processing is interrupted prior to the start of the processing and therefore, damage to the wafers is prevented and another attempt to continue processing can be made at a later time when the alarm condition has been resolved. Further, the pre-programmed recovery procedures, including operator selectable recovery procedures, allow a very smooth and flexible recovery of the system to prepare it for further processing. Other technical benefits are apparent from the following descriptions, illustrations and claims.

BRIEF DESCRIPTION OF THE DRAWINGS

Non-limiting and non-exhaustive preferred embodiments of the present invention are described with references to the following figures wherein like reference numerals refer to like parts throughout the various views unless otherwise specified.

DETAILED DESCRIPTION OF THE PREFERRED EMBODIMENTS

A method of the present invention includes a method to prohibit the loading and processing of wafers prior to the start of processing when an error in the process tool occurs. The method can be used in any one of a number of systems where work pieces are processed in a processing station. The method can be used for single wafer processing tools and for batch processing tools. Further, the method can advantageously be applied on tools comprising a plurality of processing stations. Interruption of the processing in such a multi-station tool requires an elaborate recovery procedure to bring the wafers of which the processing has been interrupted in a defined state and the present invention can be beneficially applied to such multi-station process tools. The examples presented in the following figures relate to batch furnaces and are for illustrative purposes only and are not intended to limit the application of the present invention to such examples.

Figure 1:
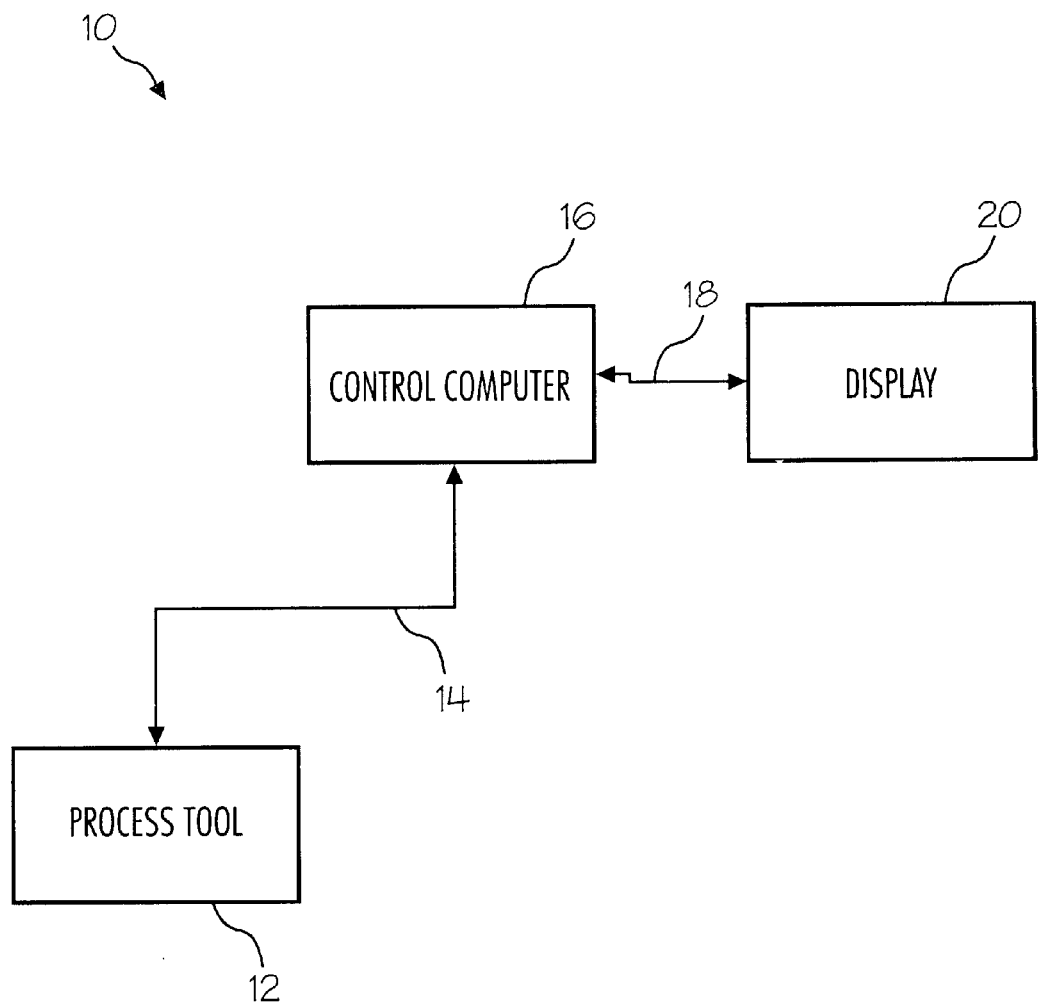
FIG. 1 is a block diagram of a manufacturing system 10 in accordance with the teachings of the present invention

For example, FIG. 1 is a block diagram of a manufacturing system 10 in accordance with the teachings of the present invention. Manufacturing system 10 includes a process tool 12 coupled to a control computer 16 via input/output line 14 and a display 20 coupled to the control computer 16 via input/output line 18.

Process tool 12 may be any tool wherein a work piece, such as a semiconductor wafer, undergoes one or more processing steps. Each of the processing steps performed by process tool 12 will typically be performed in a processing station that is provided as part of the process tool 12.

Control computer 16 can be any device capable of sending commands to process tool 12 in order to control the operation and functionality of process tool 12. Control computer 16 may include a memory for storing a process control system program and a processor for executing the process control system program. Control computer 16 may be a proprietary device or may be implemented using a general-purpose computer. An example of a general purpose computer is a personal computer based on an INTEL processor such as the PENTIUM family of processors and running an operating system such as DOS, OS2, or Windows 3.1, 95, 98, ME, NT, 2000, XP or the like. Such a general-purpose computer could perform all the control functions required for the process tool to control the process parameters like gas flows, temperature, and to control the movements of robots and the transfer of wafers. It is also possible that the control computer 16 interfaces with additional controllers within process tool 12 wherein each additional controller performs part of the control tasks. Control computer 16 is coupled to process tool 12 via input/output line 14. Input/output line 14 can be any type of wired or wireless data connection.

Display 20 couples to control computer 16 via input/output line 18 and receives information regarding the processing of a work piece in process tool 12. Display 20 can display a graphical user interface that allows an operator to monitor and control the processing of the work piece. Input/output line 18 can be any connection, wired or wireless, that permits the transfer of data between control computer 16 and display 20. Input/output line 18 can be a connection over a local or wide area network to allow for the remote viewing of processing data.

Display 20 may be a display integrated as part of a control console that can include control computer 16 for process tool 12. In this embodiment, control information may be sent back to process tool 12 via control computer 16. Display 20 may be a conventional cathode ray tube (CRT) monitor, a liquid crystal display (LCD) or plasma monitor.

Figure 2:
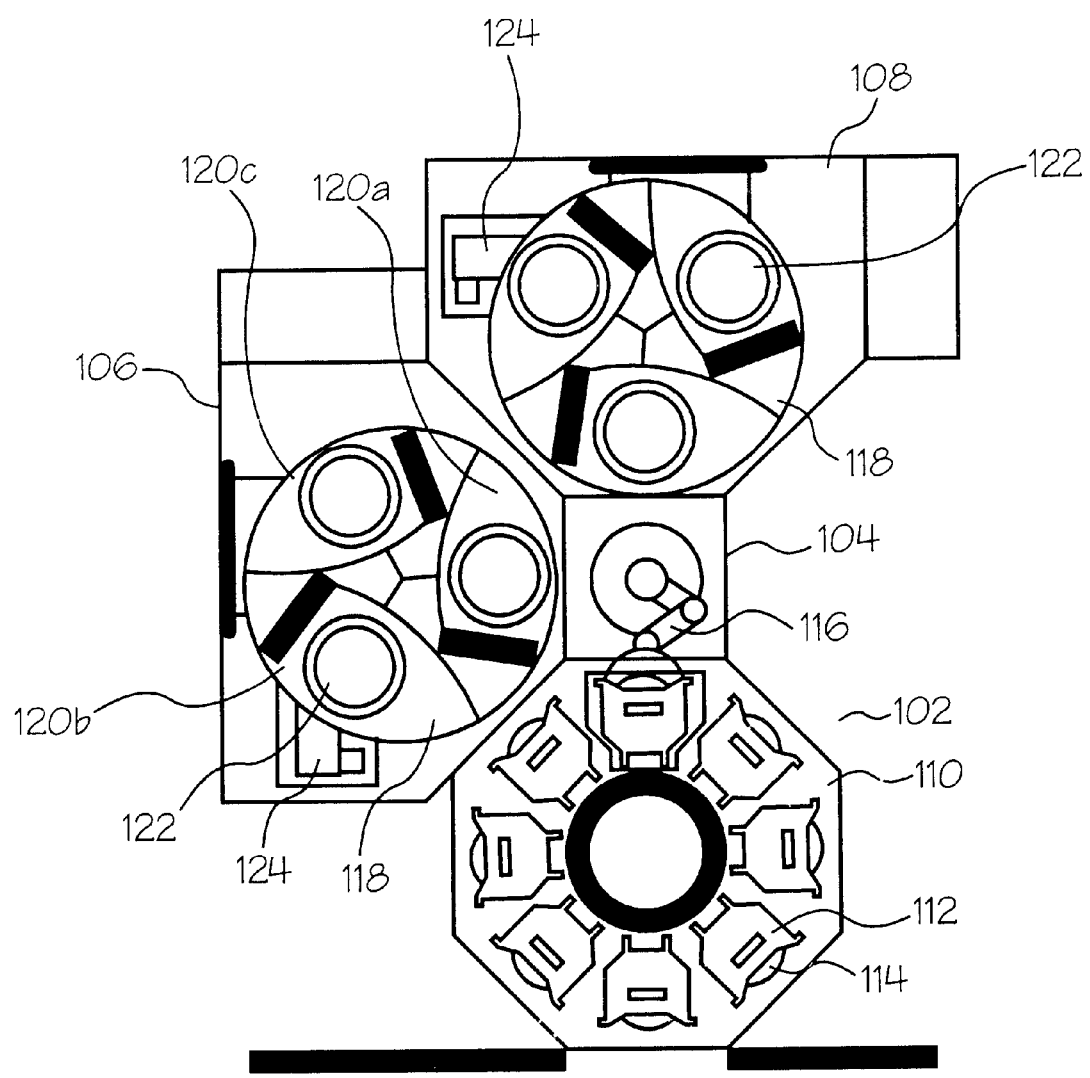
FIG. 2 is a schematic illustration of an exemplary process tool.

FIG. 2 is a schematic illustration of an exemplary process tool 12. Process tool 12 comprises a work-in-process (WIP) module 102 coupled to a robot module 104. A first reactor module 106 and a second reactor module 108 are coupled to robot module 104.

Work-in-progress module 102 in one embodiment includes a multilevel storage module 110 in which each level contains a number of cassettes 112. Each cassette 112 holds a plurality of semiconductor wafers 114. In one embodiment, there are three levels in the storage module 110, each level holding eight cassettes 112, with each cassette holding twenty-five semiconductor wafers 114.

Robot module 104 is the wafer handling system of the embodiment of FIG. 2. Robot module 104 has a robot arm 116 that is operable to remove wafers 114 from cassettes 112 to load into one of the reactor modules 106 and 108. Robot arm 116 can also move wafers 114 from one reactor module to another. Robot module 104 operates under control of the control computer 16 via one or more local controllers.

First reactor module 106 comprises a reactor carousel 118 having multiple positions 120a–120c that accept wafers 114. Each position 120a–120c can include a quartz boat 122 for holding wafers. In one embodiment, reactor carousel has three positions set apart approximately 120° from each other. Reactor module 106 includes an elevator 124 that will raise the quartz boat 122 into a reactor chamber disposed above the carousel 118. Once in the reactor chamber the wafers 114 in the quartz boats 122 undergo a processing step such as chemical vapor deposition and the like.

Reactor carousel 118, in one embodiment includes three positions: a wafer load and unload position 120a, facing the robot module 116, a process position 120b whereby the wafers 114 in the quartz boat 122 can be moved to the reactor chamber by elevator 124 and a cool down position 120c. Reactor carousel 118 can rotate moving the quartz boat 122 between the positions. Typically, two quartz boats are present in the reactor module, so that during processing of a first boat with wafers in the reactor chamber, a second boat with wafers, previously processed, can cool down at the cool-down position, processed wafers can be unloaded from the boat at the wafer load and unload position into the cassettes of the WIP module 102 and to be processed wafers can be loaded into the boat. In this way, when the processing of the first boat is completed and the first boat is moved down by elevator 124 to the carousel 118, carousel 118 can rotate 120° and the prepared second boat can be elevated in the reaction chamber directly, without any loss of time. Second reactor module 108 is similarly configured.

An advantage of multiple positions on a carousel utilizing multiple boats is an increased efficiency by allowing the loading and unloading of batches and the cool down of batches in parallel with the processing of other batches. However, problems can occur in this system. If a problem occurs in processing a batch of wafers, it is important to stop the process before the next batch is loaded into a processing station so as not to spoil the wafers of the next batch. Thus, the control computer 16 must be able to control the operation of process tool 12 when a problem occurs that requires the stoppage of loading a next load of wafers for processing. This is discussed in further detail below.

Figure 3:
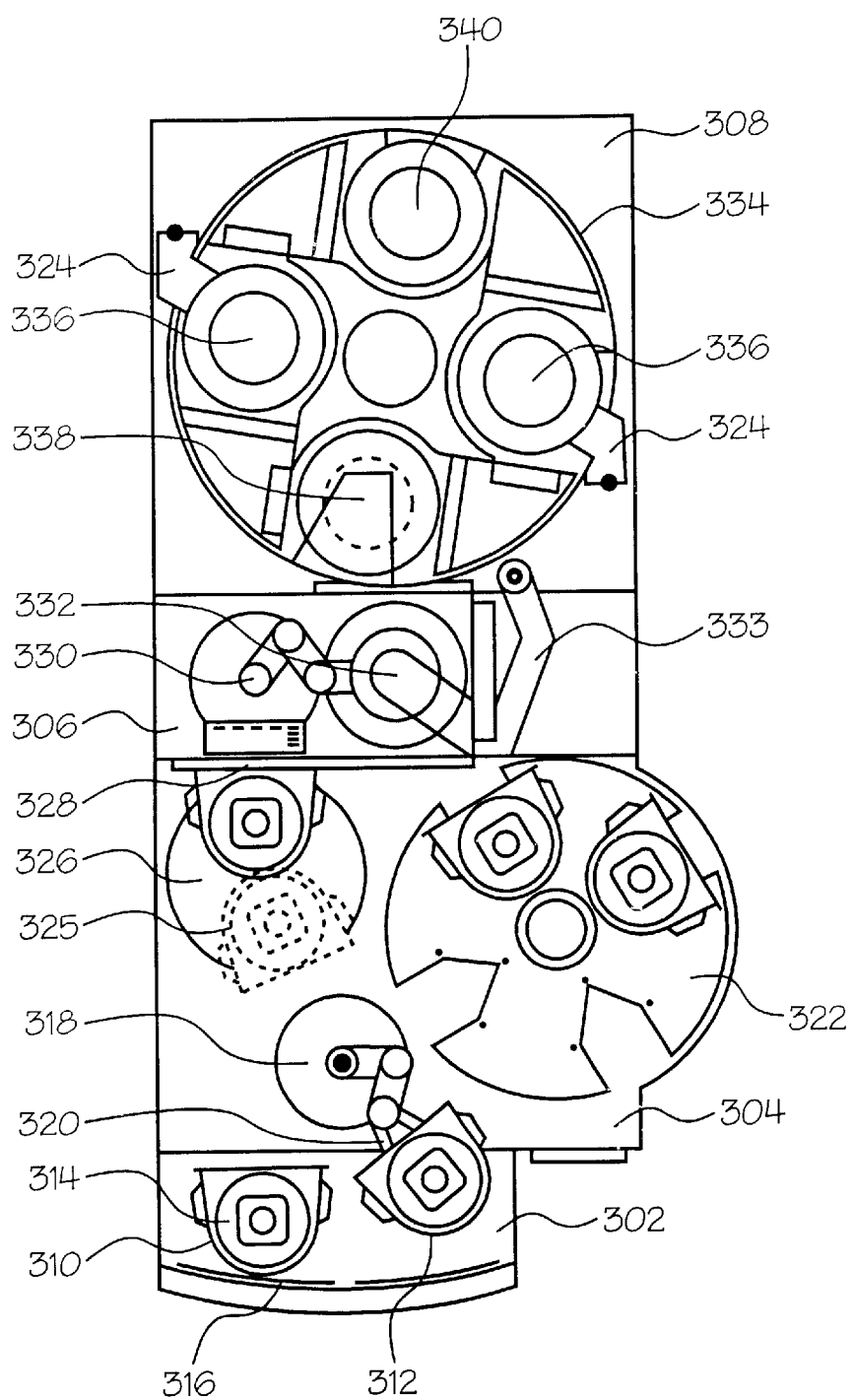
FIG. 3 is a schematic drawing of another embodiment of a process tool.

FIG. 3 is a schematic drawing of another embodiment of a process tool 12. In this embodiment, process tool 12 includes a load port section 302, a work-in-progress (WIP) section 304, a wafer handling robot section 306 and a reactor carousel section 308.

Load port section 302 comprises a left load port 310 and a right load port 312. Cassettes, also known as front-opening unified pods 314 (FOUP), containing wafers 114 to be processed, are loaded into the left load port 310 and the right load port 312. For the scope of the present invention the difference between a cassette and a FOUP is not relevant. Both are used to hold wafers prior to and after processing. Therefore, the terms "cassette" and "FOUP" will be considered as equivalent and can be used interchangeably. Load port section 302 includes shields 316 that separate the load port section from the operator's area external to the process tool 12.

WIP section 304 includes a FOUP-handling robot 318 that has a FOUP gripper 320 for attaching to FOUPs 314. WIP section 304 also includes a FOUP stocker carousel 322 that is designed to hold FOUPs 314 on one or more levels. An upper transfer module 326 transfers FOUPs 314 to an upper load port 328 and a lower transfer module, disposed below the upper transfer module 326 and not visible in the top view drawing of FIG. 3, transfers FOUPs to a lower load port, not visible, and disposed below upper load port 328. In the embodiment of FIG. 3, FOUP handling robot 318 transfers FOUP 314 from left load port 310 and right load port 312 to the FOUP stocker carousel 322. FOUP handling robot 318 also can transfer FOUP 314 from the FOUP stocker carousel 322 to the position 325 on upper transfer module 326 and to a corresponding position on the lower transfer module (not pictured). Then these modules are rotated in order for the FOUPs 314 to attach to upper load port 328 or the lower load port (not pictured).

Wafer handling robot section 306 includes a wafer handling robot 330 that removes wafers from FOUPs 314 and loads them onto a quartz boat 332 that can the be moved to the reactor carousel section 308.

Reactor carousel section 308 includes, in one embodiment, a four-position reactor carousel 334, with each carousel position operable to hold a quartz boat 332. Reactor carousel section 308 includes two reactor positions 336 where the quartz boat 332 can be lifted into one of the two reactors disposed above the two reactor positions 336 by one of the elevators 324 so that the wafers of the quartz boat 332 can undergo a processing step such as the formation of an oxide layer. The reactor carousel section 308 includes a boat input/output position 338 where a boat of wafers can be loaded onto the carousel 334 or removed from the carousel by boat transfer mechanism 333. There is also a staging station 340 where wafers can cool-down after being processed in a reactor. The two reactors can be used in parallel, such that wafers receive processing in one of the two reactors. It is also possible that wafers are processed sequentially in both reactors, first in one reactor and then in the other reactor. Sequential processing is known as tube-to-tube processing. In the system of FIG. 3, tube-to-tube processing is very efficient because it is not necessary to unload and reload the wafers from and into the quartz boat between the sequential processes.

Figure 4:
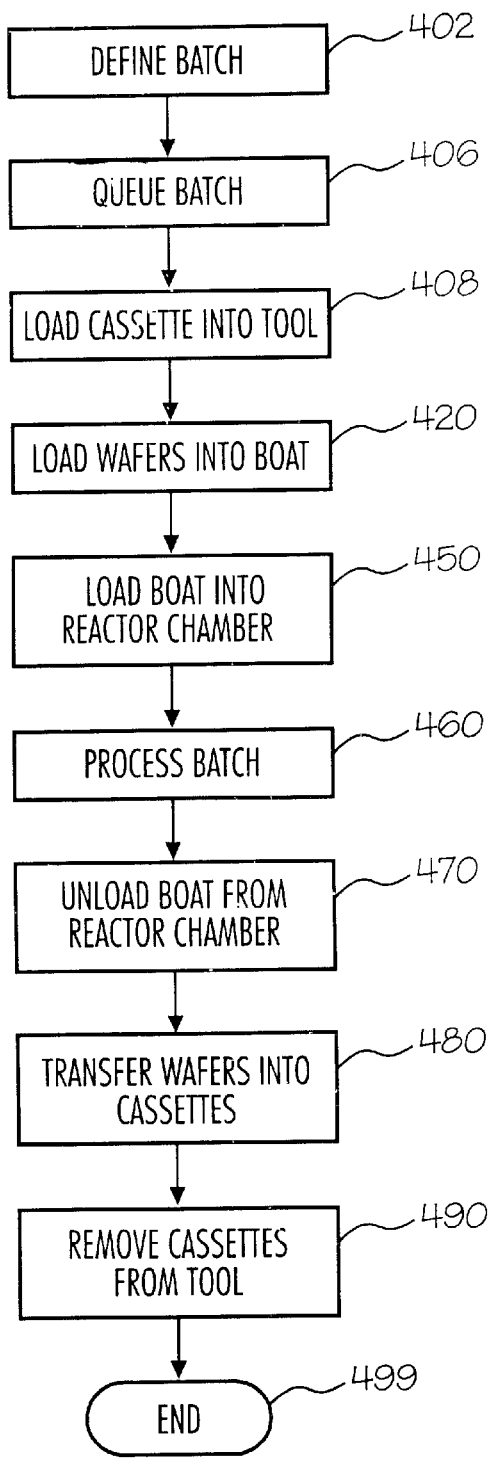
FIG. 4 is a flow chart for the operation of the process tool of FIG. 2 and FIG. 3.
Figure 5:
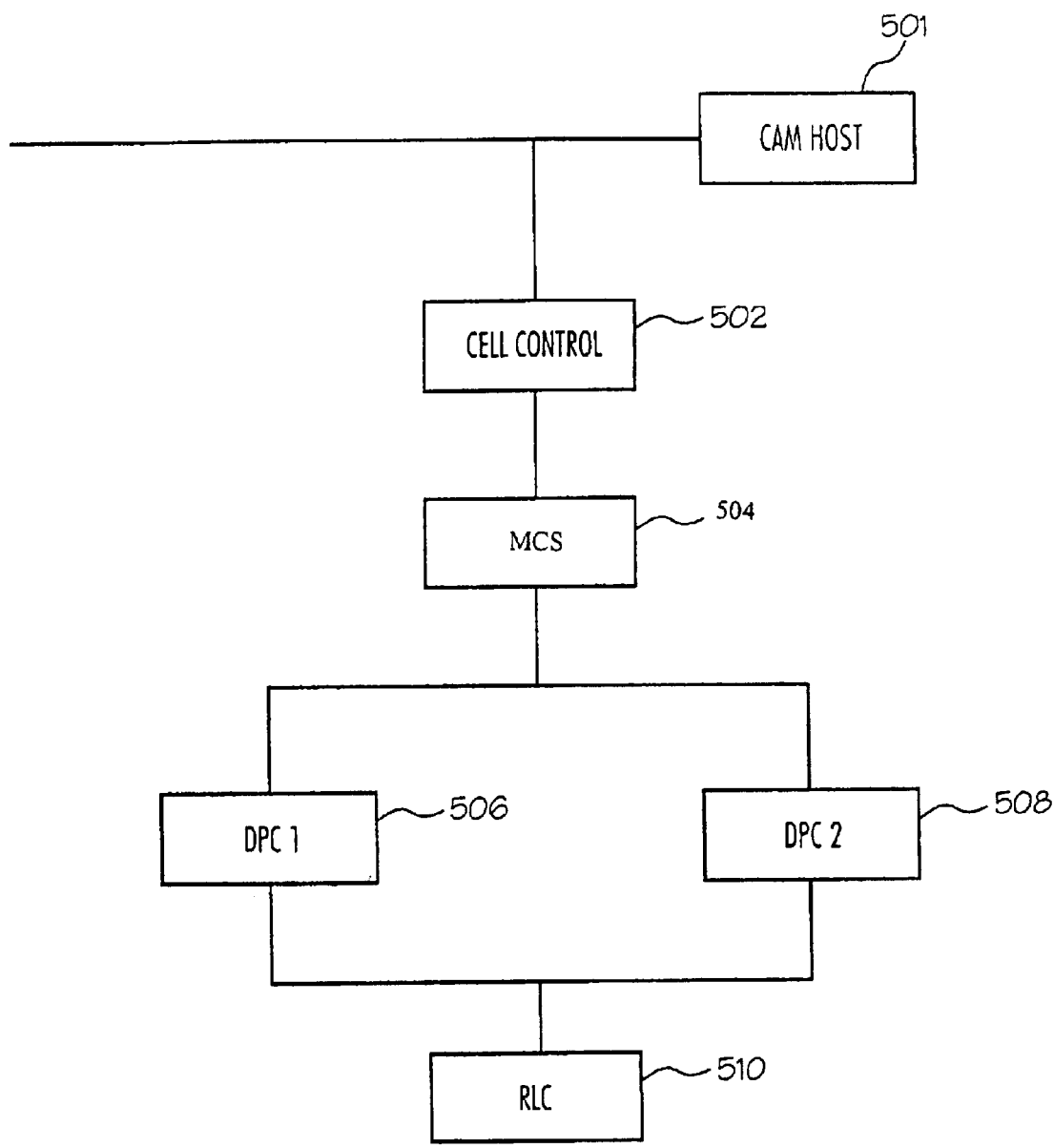
FIG. 5 is a block diagram of the communication architecture of an exemplary process tool.

FIG. 4 is a flowchart for the operation of the process tool of FIG. 2 and FIG. 3. In a first step 402, a batch is defined. The batch is defined as one or more lots of wafers as supplied in one or more cassettes or FOUPs. Typically, a batch of wafers is equal to or less than the number of wafers that can be placed on a single boat for processing. Further, in the define step it is determined which processing the wafers should receive. In step 406, the batch is queued for processing by operator input, which means that processing or loading will be started automatically as soon as the previous batch has been progressed so far that the system is available to start processing or loading the next batch. Part of the queuing process is the downloading of certain information to certain tool controllers in the process tool that are involved in the movement and processing of the semiconductor wafers. In the exemplary tools of FIGS. 2 and 3, the queuing is performed via the master control station (MCS) and information is downloaded to the robot logistic controller (RLC) because both controllers are involved in the logistics. Beneficially, the system can be programmed such that loading of the wafers onto a boat can start during processing of the previous batch in the reaction chamber. This saves time because the boat can now be loaded into the reactor chamber as soon as the previous batch is removed from the reactor chamber. Also, in the batch definition and queuing steps a computer aided manufacturing (CAM) host can be involved to ensure that a batch receives the required processing and that operator errors in batch definition are omitted. The connections between the (CAM) host, master control station and robot logistic controller is illustrated in FIG. 5.

The batch is loaded into the WIP module 102 by inserting cassettes into the WIP carousel 118, in step 408 for the embodiment of FIG. 2. For the embodiment of FIG. 3, the FOUPs 314 are first loaded into load ports 310 and 312. These FOUPs 314 are then loaded into WIP module 304 by FOUP handling robot 318.

In step 420 wafers are transferred from cassettes to a wafer boat. For the embodiment in FIG. 2, robot arm 116 moves the wafers from those cassettes in the WIP module 102 that are part of the batch to a quartz boat on the carousel. For the embodiment of FIG. 3, the FOUPs 314 are moved to a FOUP load port 328 where the wafers are removed from the FOUPs 314 by the FOUP handling robot arm 330 and placed in quartz boat 332.

In step 450, the boat, loaded with wafers, is transferred to the reactor chamber. For the embodiment of FIG. 2, this is done by rotation of the carousel 118 and movement of the elevator 124. For the embodiment of FIG. 3, first the boat loaded with wafers needs to be transferred to the carousel 334 by boat transfer mechanism 333 and then the carousel transports the boat by rotation to the reactor concerned and the corresponding elevator 324 moves the boat into the reaction chamber. Then, in step 460, the batch of wafers is processed in the reactor.

After processing, the boat is unloaded from the reactor chamber and the reactor carousel rotates to move the batch to the cool down position, in step 470. Step 470 also comprises the cool-down of the boat at the cool-down position and the transfer of the boat to the unload position. In step 480, the robot arm unloads the wafers from the boat and back into cassettes or FOUPs. After completion of the wafer transfer from the boat to the cassettes or FOUPs, the cassettes or FOUPs are removed from the system in step 490. The process is completed in step 499.

FIG. 5 is a block diagram of the communication architecture of the exemplary process tool 12. A computer aided manufacturing (CAM) host 501 is operable to connect with and communicate with a plurality of process tools 12 via a cell controller 502. The process tool 12 is controlled by a master control station (MCS) 504. MCS 504 is coupled to a plurality of digital process controllers including first digital process controller 506 and a second digital process controller 508. Each digital process controller is associated with a reactor such that first digital process controller 506 is associated with a first reactor and the second digital process controller 508 is associated with a second reactor. The digital process controllers control the process parameters like gas flows, pressure, temperature and the like. A robot and logistic controller (RLC) 510 is coupled to first digital process controller 506 and second digital process controller 508.

Master control station 504 in one embodiment is a computer based control station running an operating system such as OS2 or Windows 2000. The master control station 504 is operable to run a control program controlling the operation of the process tool 12. Master control station 504 is, in one embodiment, the control computer 16 of FIG. 1. Master control station 504 is operable to run a graphical user interface to allow an operator to monitor and control the function of a process tool 12. The master control station 504 communicates with all other controllers through the digital process controllers 506, 508 for each reactor.

Digital process controllers 506, 508 run and execute the process program. In one embodiment, digital process controllers 506, 508 are coupled to master control station 504 via a serial connection such as a RS-422 serial communication link. Other communication links, serial or parallel, wired or wireless can also be used.

Robot logistics controller 510 in one embodiment, such as the one illustrated in FIG. 2, controls the wafer-handling robot and manages the WIP section of the cluster tool. For other configurations, such as that illustrated in FIG. 3, additional controllers similar to, and in communication with, robot and logistic controller may be utilized to control other robotic components such as the FOUP-handling robot. The exact configuration of the control system will vary depending on the complexity of the system and design choices. For example, all the control functions for the tool can be performed by only one computer, or alternatively, more sub-controllers can be used than shown in FIG. 5. Additional controllers may also be present in the process tools. These include temperature controllers for monitoring and regulating process temperature and motion controllers for monitoring and regulator carousel movement and reactor elevator movement.

In operation, a production control system (PCS) program is running on master control station (MCS) 504. Master control station 504 displays a graphical user interface to facilitate work interaction. The PCS program running on the MCS 504 along with worker input, can initiate the process of batches of wafers through the define batch step 402 and the queue batch step 406 as shown in FIG. 4. Commands are sent to the digital process controller and the robot and logistic controller to control the loading of cassettes, the movement and process of wafers and the unloading of cassettes. At the same time, the MCS 504 is monitoring for the generation of an inhibit next load flag. An inhibit next load flag (INL flag) is a flag in the software caused by one or more events that will not effect already started processing in the reactor chamber but prohibit the next batch of wafers from being processed. It will also prevent loading of the wafers of a next batch into a boat, if the wafer transfer has not yet started. This saves the unprocessed wafers from potential damage. When the MCS 504 receives the inhibit next load flag, certain steps, initiated either by an operator or by the process control program can take place. The causes of the inhibit next load flag and corrective actions available after an INL flag is set are discussed in further detail below.

Figure 6:
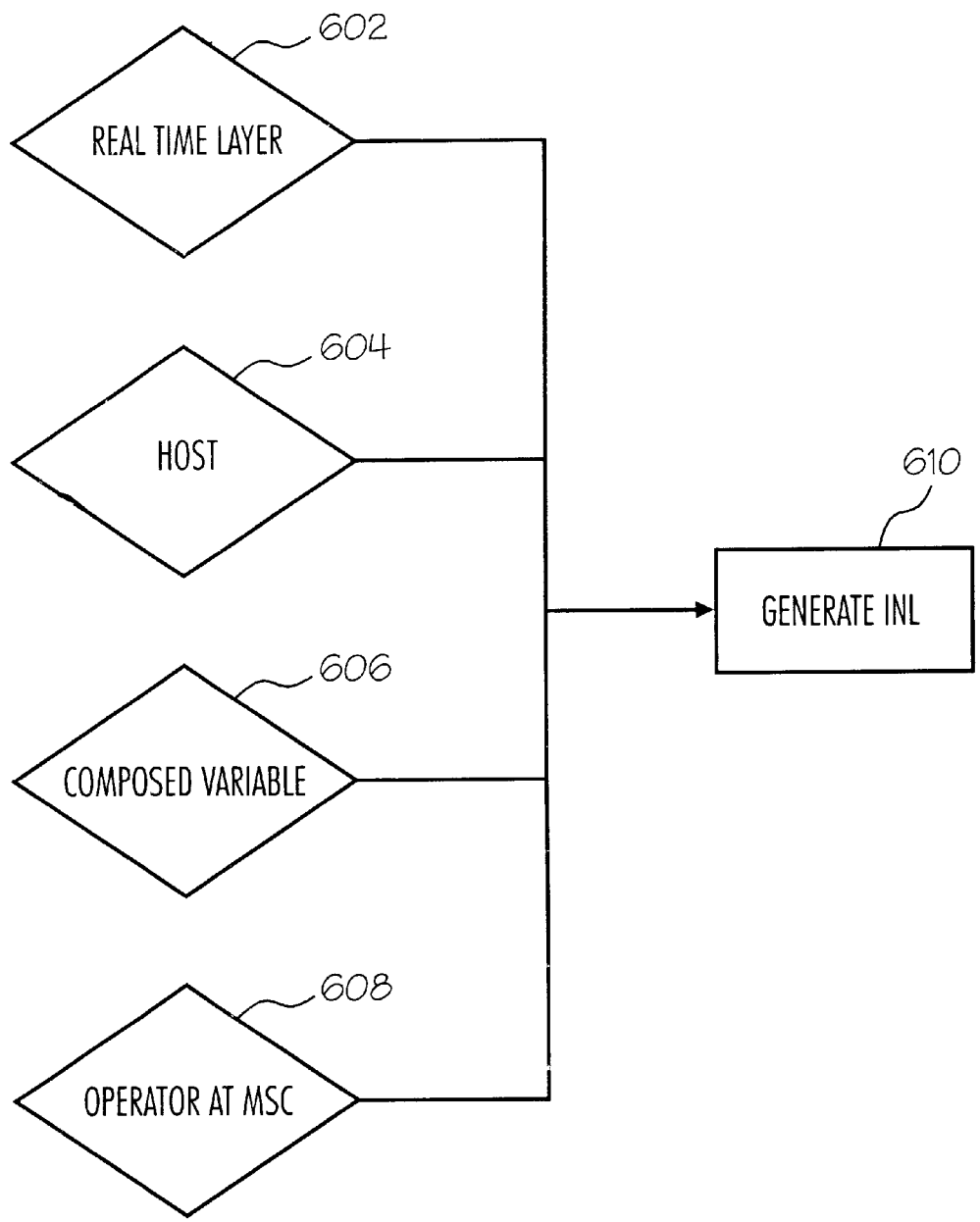
FIG. 6 is a flow chart that shows different ways in which an inhibit next load (INL) flag can be set.

FIG. 6 is a flowchart that shows different ways in which an inhibit next load (INL) flag can be set. In box 602, the INL flag is set in the real time layer. The real time layer comprises the digital process controllers 506, 508, the robot and logistic controller 510 and other controllers necessary in the process tool and involved in monitoring and controlling the process parameters and other conditions in the process tool. Alarms can be defined indicating that a process parameter or other condition deviates from a desired value. Further, it can be defined if the occurrence of a certain alarm should result in the generation of an inhibit next load flag. The setting of an INL flag in the real time layer indicates that a situation has occurred that is not favorable for the process result. Although the process result might still be within the required specification limits, there is an increased risk that a situation will develop that requires an immediate process interruption, with all the disadvantages and damage to the wafers concerned, which should be prevented. When in the real time layer a condition occurs that is programmed to result in the setting of an INL flag, the INL flag is set in box 610.

In box 604, the INL flag may be set by a higher level computer, to which the master control station of the process tool is connected, like a computer aided manufacturing (CAM) host computer system. The CAM host computer may control a number of tools on an assembly line, including a process tool. In this case, a user of the process tool has one or more reasons that require the system to be halted. Examples include scheduled preventative maintenance routines that need to be run, problems with a downstream process tool in the manufacturing line, requiring the suspension of one or more upstream process tools, or the results of a wafer analysis on a wafer inspection tool of a wafer previously processed on the tool, the results being collected and evaluated via the CAM host and found to be outside the specification limits. The condition on which the inhibit next load flag should be generated can be pre-programmed but can also be generated by manual input into the host computer. When the condition for generation of the INL flag is fulfilled, the INL flag is generated in box 610.

In box 606, the INL flag is set by an alarm on a composed variable. A composed variable is a user defined expression that can include one or more process parameters and measurement data. Examples are the average value of a real time process parameter during a certain recipe step, the time required to pump down a reactor chamber to a certain pressure, or a trend in deposited film thickness for subsequent runs. The composed variable alarms are designed to look at composed variables and determine if the parameters are such that the next batch of wafers should be processed or not. Examples of composed variable alarms include measurement data on a wafer which are still within the specification limits but show a systematic trend and deviate increasingly from a target value. If a composed variable alarm condition occurs for which the setting of an inhibit next load flag is specified, the inhibit next load flag is set in box 610.

Finally, in box 608, an operator can manually set an inhibit next load flag by click button pushing or other input into the master control station via its operator interface. In that case, the inhibit next load flag is set in box 610.

Figure 7:
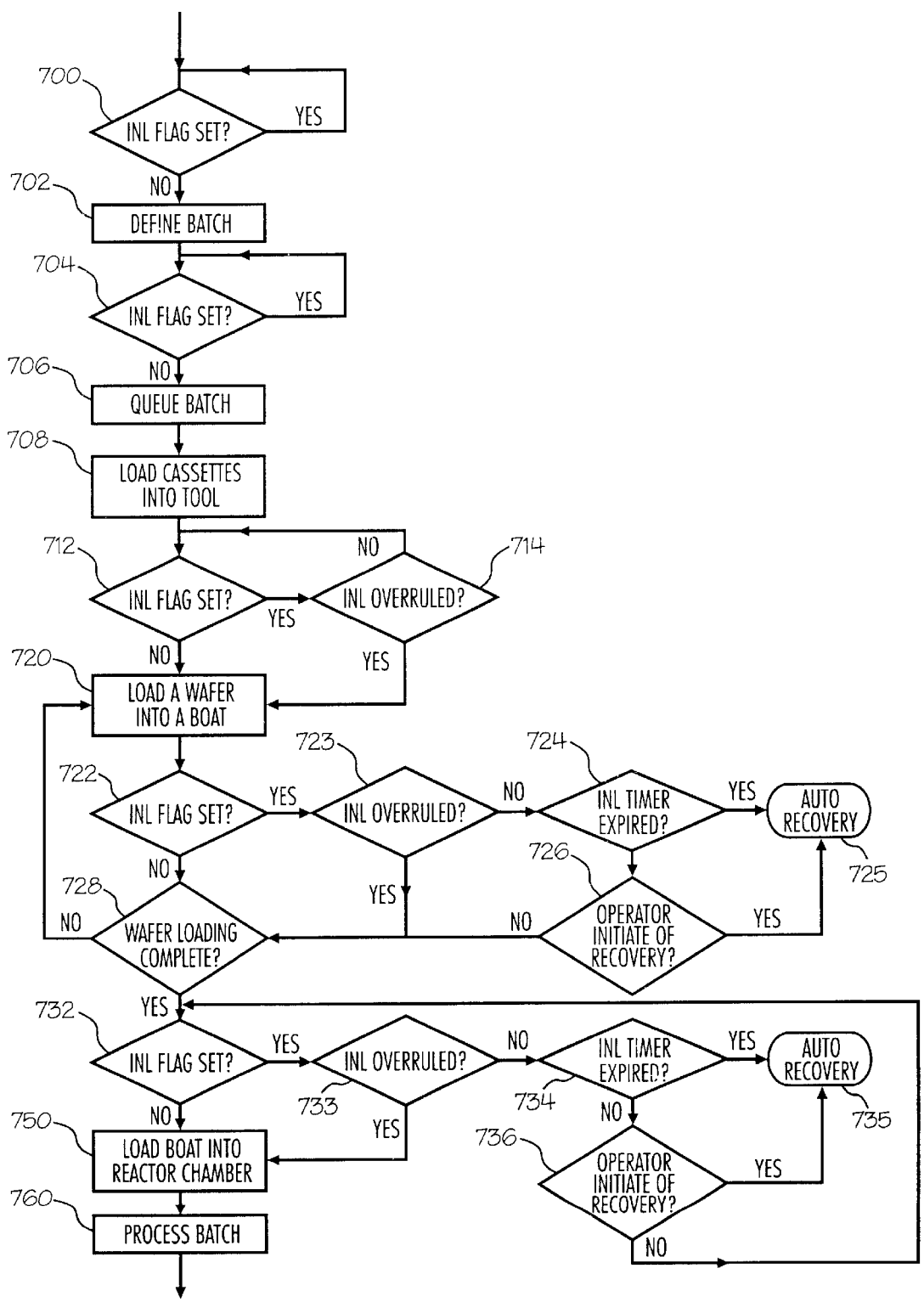
FIG. 7 is a flow chart illustrating interruption of a batch process sequence by an inhibit next load flag.

FIG. 7 is a flow chart illustrating the use of a INL flag in the process sequence as shown in FIG. 4. Similar steps are indicated with similar reference numbers. The define batch step 702, the queue batch step 706 and the load cassettes into tool step 708 were already explained in the context of FIG. 4. The system is continuously monitoring to see if an INL flag has been set. When this is the case prior the queue batch step 706, or even prior to the define batch step 702, the INL flag will halt the system so that continuation is not possible. Consequently, if an INL flag has been set it will not be possible to define a batch, or when the batch was already defined but not queued, it will not be possible to queue the batch. Further continuation is only possible when the INL flag has been removed. When the cassettes have been placed into the tool as indicated in step 708, but the wafer transfer has not been started yet, in block 712 it is checked if an INL flag has been set. If so, the system will be halted. During halting of the system it is continuously checked if the INL flag is still set as indicated by block 712, and if the INL flag is overruled, as indicated by block 714. When overruled, the system will resume the sequence and continue with the next step. In step 720 the loading of a wafer, or, in the case of batch processing, the loading of multiple wafers is indicated. After completion of the transfer of a wafer, again it is checked if an INL flag is set as indicated by block 722 and a check if the INL flag has been overruled takes place as indicated by block 723. However, after the wafer transfer has been started, a more difficult situation is present. The essence of the INL flag is that in case of an alarm condition a batch is halted prior to starting the actual processing. In the context of the present invention, "processing" is understood to be subjecting one or more wafer in a process chamber to a process.

The start of the process is when the actual "subjecting one or more wafers in a process chamber to a process" starts and the logistics prior to the processing are distinguished from the process. When the INL flag is set at some moment in time prior to the start of the processing in the reaction chamber, a choice can be made between immediate halting the progress of the next batch or delay the halting of the next batch, such that the start of actual processing is prevented. Further, halting of the progress leaves a partially transferred batch in the system which is undesired. In the example of FIG. 7, the progress is not immediately halted and options are available so that after halting a batch, the wafers that were already transferred from a cassette to the boat are returned to the cassettes. When an INL flag is set after loading has started, but before starting the actual processing in the reaction chamber, an unload timer is started. The time counted down by the unload timer is selectable. It is possible to select a zero time, a finite time such as 15 minutes, or an infinite time. When the INL has not been overruled, in block 724 it is checked if the unload timer has been expired. If so, an auto recovery procedure will start as indicated in block 725 such that the system ends in a defined state. The auto recovery procedure used is that the boat is unloaded and the wafers are returned to the cassettes. However, other auto recovery procedures can be programmed depending on the exact system configuration. When the unload timer is not expired, it is checked in block 726 if the operator has pushed the unload button to begin immediate unload of the loaded but unprocessed wafers. If so, unloading starts immediately, without waiting for the expiration of the timer. If not, and in the case that the INL flag has been overruled, it will be checked if the loading is complete, as indicated in block 728. When the loading is not complete, a next wafer will be loaded to the boat and the loop starts again. When the wafer loading is complete it will be checked again if the INL flag is set in block 732. If not, the sequence will go to the next step which is loading the boat into the reaction chamber as indicated by block 750. When the INL flag is set it is checked if the INL is overruled as indicated by block 733. If so, the system also continues with loading the boat into the reaction chamber as indicated by block 750. If the INL flag is not overruled, the system will wait until the unload timer is expired or the operator pushes the unload button for immediate unload, as indicated by blocks 734, 735 and 736 and the corresponding connections. Alternatively, the INL flag can disappear before unloading starts. In that case the system after all resumes processing and proceeds to block 750.

In the example of FIG. 7, when the loading of the boat into the reaction chamber has started, the setting of an INL flag will not influence the process anymore. The boat elevation step is part of the process recipe which makes it rather obvious to select the start of the boat elevation step as the start of the process. Further, in the exemplary case, the reactor chambers are furnaces, and loading the boat into the reactor exposes the wafers to a thermal budget, which is undesirable if the corresponding actual process is not carried out. However, other choices can be made. For other systems it is possible that even after placing a wafer in the process chamber and before starting the actual processing, possible interruption of the sequence by the INL flag can be programmed.

Although in FIG. 7 the situation batch processing is illustrated, wherein a plurality of wafers is processed simultaneously, it is clear that in single wafer processing wherein a batch of wafers is processed sequentially a somewhat adapted loop is required. However, the principle remains the same: when an INL flag is set, the start of the processing of a wafer is prohibited whereas already started processing is not effected.

Figure 8:
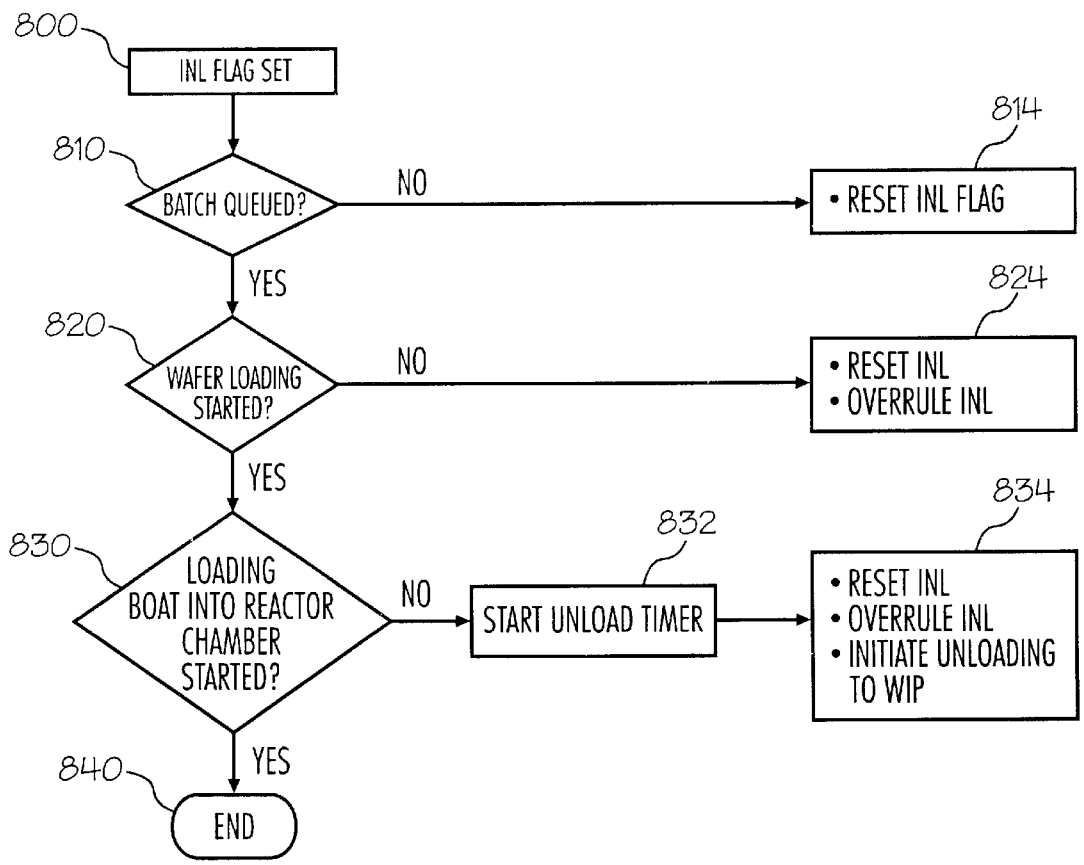
FIG. 8 is a block diagram illustrating the operator selectable options after the interruption of a process by an inhibit next load (INL) flag.
Figure 9:
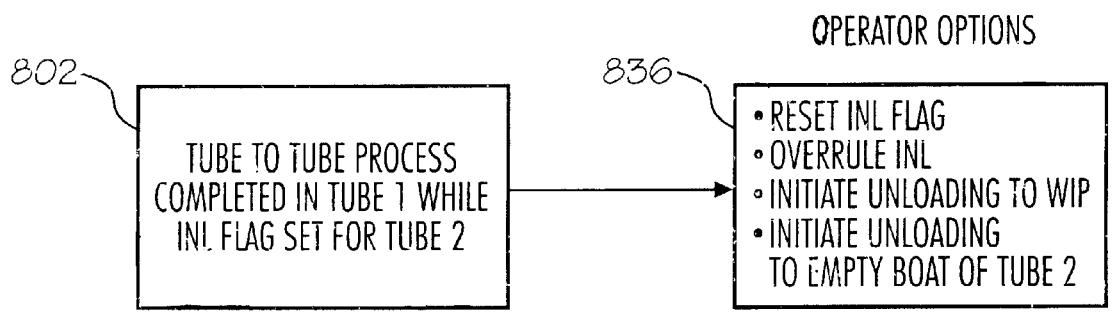
FIG. 9 is a block diagram illustrating the operator selectable options after the interruption of a process by an inhibit next load (INL) flag in a specific tube-to-tube case.

FIG. 8 and FIG. 9 are block diagrams illustrating in an other way what happens after an INL flag has been set and which options are available for an operator. In these figures, identical functions are indicated by identical reference numerals. Block 800 indicates that an INL flag has been set. In block 810 it is checked if the batch is already queued. If not, the only option available is "Reset INL", as indicated in block 814. However, if the alarm condition, resulting in the INL, is still active, it will not be possible to reset the INL flag because it is instantaneously set again. In alternative cases, when an INL has been generated by some step in the total sequence, different from the current step, it will be possible to reset the INL but it will be set again when the sequence passes that step again. When the batch has been queued but wafer loading not started yet, as checked in block 820, another option becomes available: "Overrule INL", as indicated in block 824. With the overrule function, the interruption is overruled, but only for the subject batch. For the following batches the INL flag remains fully functional. When wafer loading has started, it will be checked if loading of the boat into the reactor has started as indicated by block 830. If so, the INL has no effect anymore and the operator does not need any options. If the loading of the boat into the reactor has not started yet, the unload timer is started, as indicated in block 832. Before expiration of the unload timer the options "Reset INL", "Overrule INL", and "Initiate unloading" are available, as indicated by block 834. Upon pushing the "Initiate unloading" button, the Auto recovery procedure is immediately started, without further waiting for the expiration of the unload timer.

In FIG. 9, the specific situation of a tube-to tube process is addressed. As discussed previously, in a tube to tube process two processes are scheduled in the tool sequentially: first the wafers undergo processing in a first reactor chamber and then the wafers undergo processing in a second reactor chamber in the same tool. A special situation occurs when the first process in the first tube has been completed and an INL flag is set for tube 2. The possible options are given by FIG. 9. In block 802 the starting situation is indicated, whereas in block 836 the available options are indicated. In addition to "Reset INL", "Overrule INL", and "Initiate unloading to WIP" there is the option "Initiate unloading to empty boat of tube 2". This last option can be used when it is expected that processing in tube 2 can be resumed soon. In the exemplary system of FIG. 2, it is important to remove a processed tool-to tool batch from the first reactor module when an INL flag is set for tube 2 because it allows at least the utilization of tube 1 in a standard single tube mode.

Figure 10:
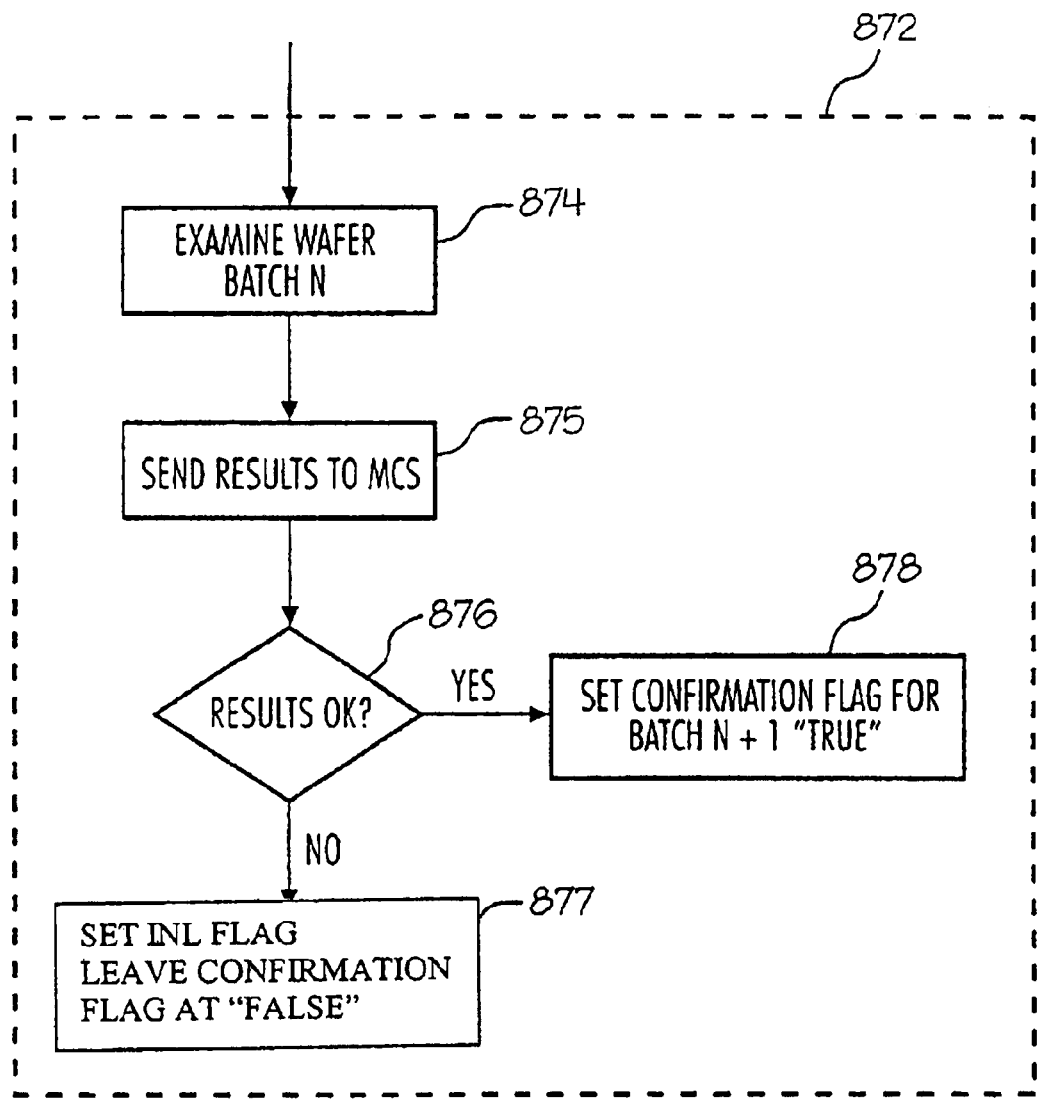
FIG. 10 is a flow chart illustrating the execution of an integrated metrologyrecipe.

In addition to an INL flag, an additional flag can be used called the "Confirmation flag". Whereas the INL flag is used to indicate a problem and prohibit the start of a process when there is a problem, the confirmation flag is used as a positive confirmation that processing can go forward. In particular, this confirmation flag can be used as a final approval before the actual processing starts. The approval is obtained from the measurement of a previously processed wafer and analysis of the results and comparison of the results with specification limits. Schematically this is illustrated in the flowchart of FIG. 10. In block 874, a wafer of batch N where N is an integer number representing a current batch is analyzed after processing. Preferably, the wafers are examined in a wafer inspection system that is connected to the process tool. For example, in the embodiment of FIG. 3 a wafer inspection station could be integrated in communication with the wafer handling robot section such that the wafer handling robot can move wafers into the inspection system. The measurement system can include an optical system to measure the thickness of the film formed on the wafer during the process. Alternatively the measurement system can include a vision system including a video camera attached to a microscope lens apparatus for examining the surface of the wafer. Other components can also be present to assist in qualitative and quantitative measurements. The measurement can be performed according to an integrated metrology (IM) recipe defining what part of the wafer is being examined as well as, the parameters used and the criteria used to decide if the result is within the specification limits. This IM recipe may be permanently present in the code being run on the master control station 504, or, alternatively, the recipe can be downloaded from a higher level controller such as the CAM host when the IM recipe is needed. Upon availability of the IM recipe, the wafers undergo examination. In an embodiment the wafer ID is read off the wafer by the vision system. In a typical embodiment, a number of points on the wafer are chosen and the thickness of the applied layer (such as an applied oxide layer) is measured. The number of points can be predetermined by the measurement recipe or selected by the operator of the tool. Information such as the thickness at each point, the mean thickness, the median thickness and the maximum value, the minimum valve and the standard deviation can be calculated. Any of these values can be compared to a predetermined specification limits and to determine if the measurements are within or outside of the specification limits and if the confirmation flag can be set to "true" and if an INL flag needs to be set.

Figure 11:
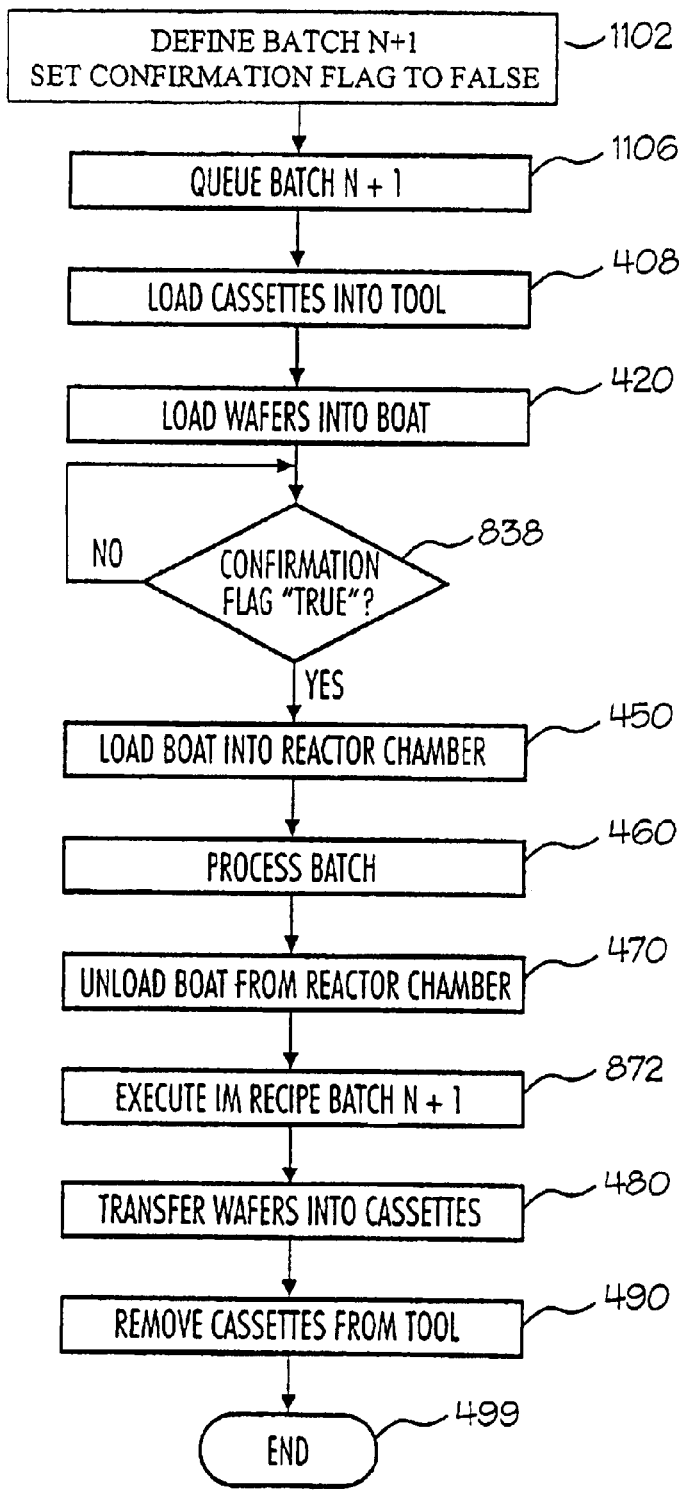
FIG. 11 is a flow chart illustrating the use of a confirmation flag prior to the start of a process.

An alternative measurement might be the number of particles on the wafer. This required a particle counter. In a particle counter the measurement system locates and measures particle defects on the surface of the processed wafer. Again, the particle count can be compared with the specification limits for particle counts and it can be determined if the confirmation flag can be set to "true" or if an INL flag should be set. After one or more measurements are made, the results are sent to the MCS in step 875. Then, in step 876 the process analysis program running on the MCS determines, in conjunction with the measurement recipe and the data from the measurements, if the results are with the specification limits. When the results are within the specification limits, the Confirmation flag can be set "true", as indicated by block 878. When the results are outside the specification limits, the confirmation flag is left as "false", which is the state the confirmation flag is set when a batch is defined as seen in FIG. 11, step 1102 and an INL flag can be set as indicated by block 877. All of these steps can be performed in the method as shown in the following figure, FIG. 10, at step 872.

In FIG. 11 a complete sequence is given with the use of a Confirmation flag. The sequence is based on the sequence of FIG. 4, wherein identical steps are indicated by identical reference numerals. The steps that are common to FIG. 4 are discussed in detail in conjunction with FIG. 4. Some steps are added and some steps are slightly changed. The first two steps are now called "Define batch N+1", step 1102, and "Queue batch N+1", step 1106 where N is an integer number. Before the start of the actual processing a check is performed if the Confirmation flag is set, as indicated by step 838. In our case the check is performed before loading the boat into the reaction chamber but it can also be performed at an earlier stage or a later stage as long as it is performed prior to the start of the actual process. After completion of the process and unloading of the boat from the reaction chamber, an Integrated Metrology recipe is carried out for batch N+1 as indicated in step 872 to measure the result and to set the confirmation flag for the next batch. Step 872 comprises the steps as shown in FIG. 10, but now for batch N+1. In order to make use of the Confirmation flag function, at the beginning of the sequence it should be set to "false". This is done in the "Define batch N+1" step 1102. Then, at a later stage, but prior to the start of the actual processing, there might be a need to set it to "true", based on measurement of the previous batch N and analysis of the results and comparison with predefined specification limits. When in the "Define batch N+1" step 1102 the Confirmation flag is already set to "true", it is in fact switched off and has no function anymore.

The present invention includes a method for the processing of one or more wafers in a process tool. In the method one or more wafers in a reaction chamber are subjected to a process. A software implemented "confirmation flag" is provided. As a default, the confirmation flag is set in a "false" state for the one or more to be processed wafers. In a wafer inspection tool a wafer previously processed in said reaction chamber is examined and the results are compared against an acceptance criteria. If the results are within the acceptance criteria, the confirmation flag is set to a "true" state. When the results are outside the acceptance criteria the confirmation flag is left in or set to a "false" state. Prior to the start of the processing of one or more to be processed wafers, the confirmation flag is checked to see if it is in a "true" state. If the confirmation flag is in a "false" state, the start of the processing of the one or more to be processed wafers is prohibited.

The present invention includes a process tool for the processing of one or more wafers. The process tool includes at least one reactor chamber for processing one or more wafers and a system controller having a processor and memory and operable to execute a process control system program and to monitor and control processing tool parameters. A wafer inspection station is coupled to the processing tool and coupled to the system controller. The wafer inspection station is operable to examine a wafer previously processed in the reaction chamber. The wafer inspection station generates wafer data and send the wafer data to the system controller. The system controller is operable to compare the wafer data against predefined limits and set a confirmation flag in a "true" state when the wafer data are within the predefined limits. Otherwise, the confirmation flag is set or left in a "false" state when the wafer data are outside the predefined limits. The start of the processing of the one or more to be processed wafers is prohibited when the confirmation flag is in a false state.

Figure 12:
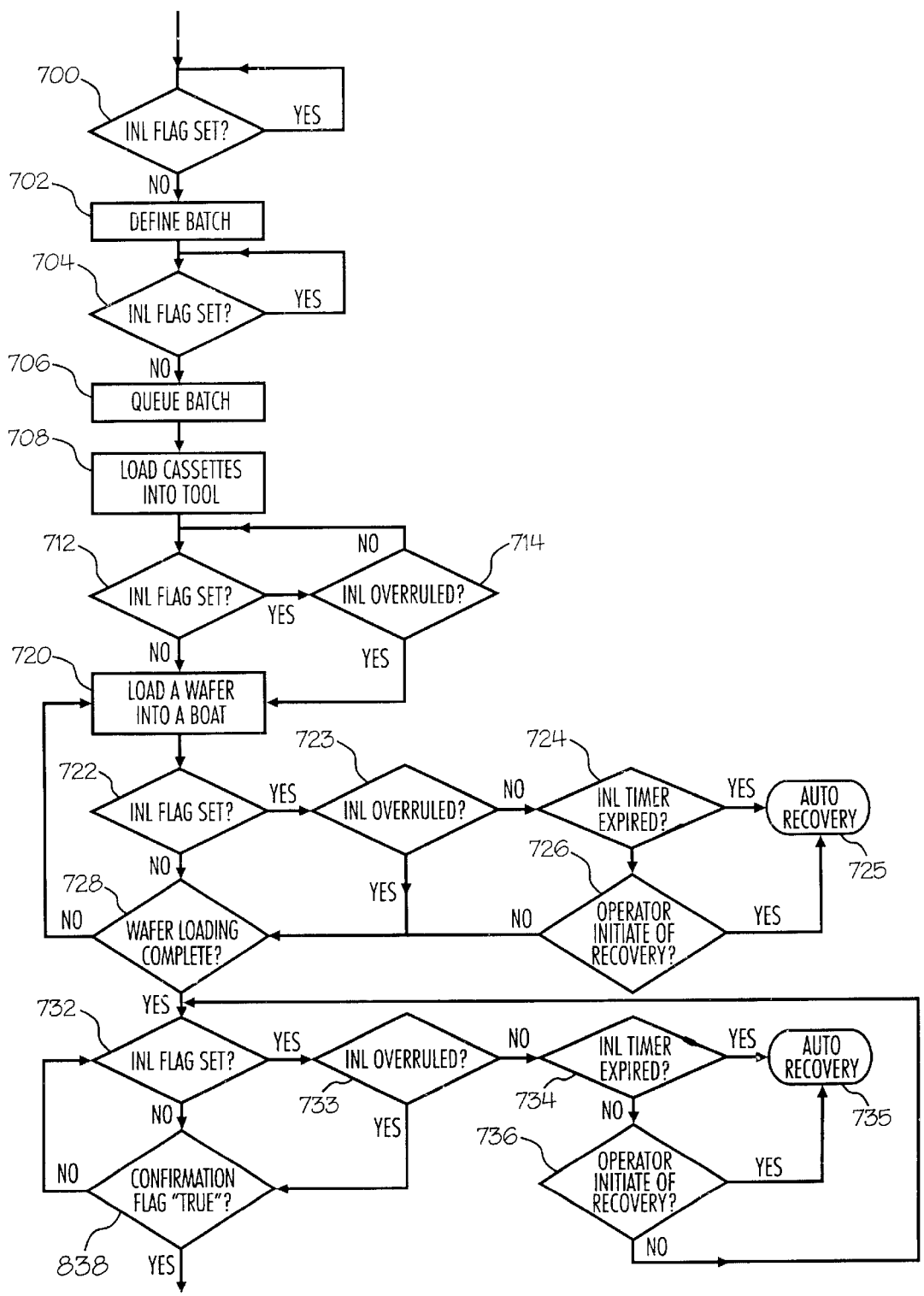
FIG. 12 is a flow chart illustrating the simultaneous use of an inhibit next load (INL) flag and a confirmation flag in a batch process sequence.

FIG. 12 is a flowchart illustrating a sequence wherein both an INL flag and a confirmation flag are used. The flowchart resembles to a large extent the flowchart of FIG. 7 and identical steps are indicated with identical reference numerals. Different is that in the flowchart of FIG. 12, after it is checked if the INL flag is set in step 732, in step 838, a check if the confirmation flag has been set is made. If the confirmation flag is not set, the system will wait in a loop, continuously checking the INL flag is set and the confirmation flag is set. If both the conditions "INL flag not set" and "Confirmation flag set" are fulfilled, the system proceeds to the next step 750, "Loading boat into reactor chamber" as seen in FIG. 7.

Although the use of flags to interrupt processing prior to the start of the actual processing is explained with reference to a batch processing system, it can also be applied to single wafer systems. In a single wafer processing system, typically wafers are also processed group wise, but sequentially, one after another. In that case, an INL flag should preferentially not prohibit the start of a next batch but of a next wafer. This results in the situation that part of the group of wafers to be processed will remain unprocessed but it gives the greatest security. In case of using Integrated Metrology in combination with the Confirmation flag, the analysis result of wafer N can set the Confirmation flag for wafer N+1. However, this could result in a waiting time after every wafer, which is undesirable. As a compromise between security and throughput, the system can also be programmed such that the analysis result for wafer N sets the Confirmation flag for wafer N+2. This still gives a short feed-back loop with a relatively high degree of security while it remains efficient.

When wafer inspection instruments are used to analyze the wafer, these wafer inspection instruments are preferably integrated into the processing tool. However, the use of the flags according to the invention is also possible when the wafer inspection instruments are not located inside the process tools but separated from the process tool. The results can be analyzed by a computer connected to the wafer inspection instrument and the outcome can be coupled to the master control station 504 via the CAM host or similar system.

Having now described preferred embodiments of the invention, modifications and variations to the present invention may be made by those skilled in the art. The invention is thus not limited to the preferred embodiments, but is instead set forth in the following clauses and legal equivalents thereof.

What is claimed:

1. A method for the processing of wafers in a process tool comprising:
    subjecting one or more wafers in a reaction chamber in the process tool to a process;
    performing one or more of the following steps in a control computer coupled to the process tool:
        a) setting an inhibit next load flag if predefined conditions occur in the process tool or by human intervention or upon input from a host computer, the inhibit next load flag not effecting the one or more wafers for which processing has started;
        b) checking, prior to the start of the processing of a to be processed wafer, to see if an inhibit-next load flag has been set;
        c) prohibiting to start processing, in the reaction chamber, of the to be processed wafer, if an inhibit next load flag has been set; and
        d) providing pre-programmed recovery procedures, such that after execution of a pre-programmed recovery procedure the to be processed wafer of which the start of the processing is prohibited ends in a defined state such that the tool can be used for further processing.

2. The method of claim 1 wherein the step of providing pre-programmed recovery procedures includes the step of providing operator selectable recovery procedures.

3. The method of claim 2 wherein the step of providing operator selectable recovery procedures includes the step of allowing an operator to reset the inhibit next load flag if said predetermined condition is no longer true.

4. The method of claim 2 wherein the step of providing operator selectable recovery procedures includes the step of allowing an operator to overrule the inhibit next load flag for the immediate next to be processed wafer.

5. The method of claim 1 wherein the predefined condition is based on an alarm level of a real time parameter, the real time parameter representing real time conditions in the process tool.

6. The method of claim 1 wherein the predefined condition is based on an expression comprising one or more parameters out of a collection of a plurality of real time parameters, representing real time conditions in the process tool, and analysis results of a wafer processed prior to the to be processed wafer.

7. The method of claim 1 wherein the predefined condition is a "set inhibit next load flag" command, initiated by an operator command.

8. The method of claim 1 wherein the predefined condition is a "set inhibit next load flag" command, initiated by a higher level controller, connected to the tool controller.

9. The method of claim 1 wherein the to be processed wafers are supplied to the processing tool in cassettes and the step of providing pre-programmed recovery procedures further comprising initiating an automatic transfer of the to be processed wafers that has been removed from the cassette and of which the start of the processing is prohibited.

10. The method of claim 9 wherein the step of initiating an automatic transfer of the to be processed wafers that have been removed from the cassette and of which the start of the processing is prohibited comprises transferring said wafers to the cassette.

11. The method of claim 1 wherein the step of providing pre-programmed recovery procedures further comprises initiating a hold unload timer during which no automated response to the inhibit next load flag is started.

12. The method of claim 11 wherein the step of initiating a hold unload timer further comprises allowing operator intervention when the hold unload timer is operational.

13. A process tool for processing one or more wafers supplied, comprising:
at least one reaction chamber for subjecting the one or more wafers to a process;
a tool controller having a processor and memory and operable to execute a process control system program, the process control system program operable to monitor and control tool parameters; and
wherein the tool controller is operable to generate an inhibit next load flag upon predefined inputs and, when the inhibit next load object is generated prior to the start of the processing of a to be processed wafer, prohibit the start of the processing of the to be processed wafer in the reaction chamber, and to provide pre-programmed recovery procedures such that after execution of a preprogrammed recovery procedure the to be processed wafer ends in a defined state such that the tool can be used for further processing.

14. The process tool of claim 13, wherein the tool controller comprises one or more subcontrollers, connected to the tool controller, the one or more sub-controllers performing part of the tasks of the tool controller.

15. The process tool of claim 13 wherein the pre-programmed recovery procedures includes operator selectable recovery procedures.

16. The process tool of claim 15 wherein the operator selectable recovery procedures includes resetting the inhibit next load flag if said predetermined condition is no longer true.

17. The process tool of claim 15 wherein operator selectable recovery procedures includes overruling the inhibit next load flag for the immediate next to be processed wafer.

18. The process tool of claim 13 wherein the predefined condition is based on an alarm level of a real time parameter, the real time parameter representing real time conditions in the process tool.

19. The process tool of claim 13 wherein the predefined condition is based on an expression comprising one or more parameters out of a collection of a plurality of real time parameters, representing real time conditions in the process tool, and analysis results of a wafer processed prior to the to be processed wafer.

20. The process tool of claim 13 wherein the predefined condition is a "set inhibit next load flag" command, initiated by an operator command.

21. The process tool of claim 13 wherein the predefined condition is a "set inhibit next load flag" command, initiated by a higher level controller, connected to the tool controller.

22. The process tool of claim 13 wherein the to be processed wafers are supplied to the processing tool in cassettes and pre-programmed recovery procedures comprising initiating an automatic transfer of the to be processed wafers that have been removed from a cassette and of which the start of the processing is prohibited.

23. The process tool of claim 22 wherein the automatic transfer of to be processed wafers that have been removed from the cassette comprises transferring the to be processed wafers to the cassette.

24. The process tool of claim 13 wherein the pre-programmed recovery procedures further comprise initiating a hold unload timer during which no automated response to the inhibit next load flag is started.

25. The process tool of claim 24 wherein initiating the hold unload timer further comprises allowing operator intervention when the hold unload timer is operational.

26. A method for the batch-wise processing of wafers in a process tool comprising:
subjecting wafers batch-wise to a process in a reaction chamber in the process tool;
performing one or more of the following steps in a control computer coupled to the process tool:
a) setting an inhibit next load flag on predefined conditions, the inhibit next load flag not effecting the processing of a wafer batch of which the processing has already started;
c) checking, prior to the start of the processing of a to be processed wafer batch, to see if an inhibit-next load flag has been set;
d) prohibiting to start processing, in the reaction chamber, of the to be processed wafer batch, if an inhibit next load flag has been set; and
e) providing pre-programmed recovery procedures, such that after execution of a pre-programmed recovery procedure the to be processed wafer batch of which the start of the processing is prohibited ends in a defined state such that the process tool can be used for further processing.

27. The method of claim 26 wherein the step of providing pre-programmed recovery procedures includes the step of providing operator selectable recovery procedures.

28. The method of claim 27 wherein the step of providing operator selectable recovery procedures includes the step of allowing an operator to reset the inhibit next load flag if said predetermined condition is no longer true.

29. The method of claim 27 wherein the step of providing operator selectable recovery procedures includes the step of allowing an operator to overrule the inhibit next load flag for the immediate next to be processed wafer batch.

30. The method of claim 26 wherein the predefined condition is based on an alarm level of a real time parameter, the real time parameter representing real time conditions in the process tool.

31. The method of claim 26 wherein the predefined condition is based on an expression comprising one or more parameters out of a collection of a plurality of real time parameters, representing real time conditions in the process tool, and analysis results of a wafer processed prior to the to be processed wafer.

32. The method of claim 26 wherein the predefined condition is a "set inhibit next load flag" command, initiated by an operator command.

33. The method of claim 26 wherein the predefined condition is a "set inhibit next load flag" command, initiated by a higher level controller, connected to the tool controller.

34. The method of claim 26 wherein the to be processed wafer batch are supplied to the processing tool in one or more cassettes and the step of providing pre-programmed recovery procedures further comprising initiating an automatic transfer of the to be processed wafer batch, or part thereof, to the extent that it has been removed from the one or more cassettes and of which the start of the processing is prohibited.

35. The method of claim 34 wherein the step of initiating an automatic transfer of the to be processed wafer batch, or part thereof, that has been removed from the one or more cassettes and of which the start of the processing is prohibited comprises transferring said wafer batch or part thereof to the one or more cassettes.

36. The method of claim 34 wherein during processing in the process tool a wafer batch is sequentially subjected to a first process in a first reaction chamber and a second process in a second reaction chamber and prior to completion of the first process in the first reaction chamber an inhibit next load flag is set for the second reaction chamber, the step of initiating an automatic transfer of the to be processed wafer batch or part thereof to the extent that it has been removed from the one or more cassettes and of which the start of the processing is prohibited comprises transferring the wafer batch after completion of the first process to a wafer boat of the second process chamber.

37. The method of claim 26 wherein the step of providing pre-programmed recovery procedures further comprises initiating a hold unload timer during which no automated response to the inhibit next load flag is started.

38. The method of claim 37 wherein the step of initiating a hold unload timer further comprises allowing operator intervention when the hold unload timer is operational.

39. A process tool for the batch-wise processing of wafers, comprising:
at least one reaction chamber for processing batches of wafers;
a tool controller having a processor and memory and operable to execute a process control system program, the process control system program operable to monitor and control tool parameters; and
wherein the tool controller is operable to generate an inhibit next load object upon predefined inputs and, when the inhibit next load object is generated prior to the start of the processing of a to be processed batch of wafers, to prohibit the start of the processing of the to be processed batch of wafers, and to provide pre-programmed recovery procedures so that after execution of a pre-programmed recovery procedure the to be processed batch of wafers ends in a defined state such that the tool can be used for further processing.

40. The process tool of claim 39, wherein the tool controller comprises one or more subcontrollers, connected to the tool controller, the one or more sub-controllers performing part of the tasks of the tool controller.

41. The process tool of claim 39 wherein the pre-programmed recovery procedures includes operator selectable recovery procedures.

42. The process tool of claim 41 wherein the operator selectable recovery procedures include resetting the inhibit next load flag if the predetermined condition is no longer true.

43. The process tool of claim 41 wherein the step of providing operator selectable recovery procedures includes the step of allowing an operator to overrule the inhibit next load flag for the immediate next to be processed wafer batch.

44. The process tool of claim 39 wherein the predefined condition is based on an alarm level of a real time parameter, the real time parameter representing real time conditions in the process tool.

45. The process tool of claim 39 wherein the predefined condition is based on an expression comprising one or more parameters out of a collection of a plurality of real time parameters, representing real time conditions in the process tool, and analysis results of a wafer processed prior to the to be processed wafer.

46. The process tool of claim 39 wherein the predefined condition is a "set inhibit next load flag" command, initiated by an operator command.

47. The process tool of claim 39 wherein the predefined condition is a "set inhibit next load flag" command, initiated by a higher level controller, connected to the tool controller.

48. The process tool of claim 39 wherein the to be processed batch of wafers are supplied to the processing tool in cassettes and pre-programmed recovery procedures further comprising initiating an automatic transfer of the to be processed batch of wafers that have been removed from the cassette and of which the start of the processing is prohibited.

49. The process tool of claim 48 wherein the automatic transfer of the to be processed batch of wafers that have been removed from the cassette and of which the start of the processing is prohibited comprises transferring the to be processed batch of wafers to the cassette.

50. The process tool of claim 39 wherein the pre-programmed recovery procedures further comprises initiating a hold unload timer during which no automated response to the inhibit next load flag is started.

51. The process tool of claim 50 wherein initiating the hold unload timer further comprises allowing operator intervention when the hold unload timer is operational.

52. A method for the processing of one or more wafers in a process tool comprising:
subjecting the one or more wafers in a reaction chamber to a process; providing a software implemented "confirmation flag";
as a default, setting the confirmation flag in a "false" state for the one or more to be processed wafers;
examining in a wafer inspection tool a wafer previously processed in said reaction chamber and comparing the results against acceptance criteria;
setting the confirmation flag to a "true" state if the results are within the acceptance criteria and setting or leaving said confirmation flag to a "false" state when the results are outside the acceptance criteria;
checking, prior to the start of the processing of one or more to be processed wafers, to see if the confirmation flag is in a "true" state;
prohibiting the start of the processing of the one or more to be processed wafers if the confirmation flag is in a "false" state.

53. The method of claim 52 wherein a software implemented "inhibit next load flag" is provided, comprising:
setting the inhibit next load flag on predefined conditions, the inhibit next load flag not effecting already started processing;
checking, prior to the start of the processing of one or more to be processed wafers, to see if the inhibit next load flag is set;
prohibiting the start of the processing of the one or more to be processed wafers if the inhibit next load flag is set;
providing pre-programmed recovery procedures, such that after execution of a pre-programmed recovery procedure the to be processed wafers of which the start of the processing is prohibited end in a defined state such that the process tool can be used for further processing.

54. The method according to claim 52, wherein the examination of the previously processed wafer, is performed in a wafer inspection tool outside of the process tool and the results are sent back to the process tool.

55. The method of claim 53 wherein the step of providing pre-programmed recovery procedures includes the step of providing operator selectable recovery procedures.

56. The method of claim 55 wherein the step of providing operator selectable recovery procedures includes the step of allowing an operator to reset the inhibit next load flag if said predetermined condition is no longer true.

57. The method of claim 55 wherein the step of providing operator selectable recovery procedures includes the step of allowing an operator to overrule the inhibit next load flag for the immediate next to be processed wafer.

58. The method of claim 53 wherein the predefined condition is based on an alarm level of a real time parameter, the real time parameter representing real time conditions in the process tool.

59. The method of claim 53 wherein the predefined condition is based on an expression comprising one or more parameters out of a collection of a plurality of real time parameters, representing real time conditions in the process tool, and analysis results of a wafer processed prior to the to be processed wafer.

60. The method of claim 53 wherein the predefined condition is a "set inhibit next load flag" command, initiated by an operator command.

61. The method of claim 53 wherein the predefined condition is a "set inhibit next load flag" command, initiated by a higher level controller, connected to the tool controller.

62. The method of claim 53 wherein the wafer are supplied to the processing tool in cassettes and the step of providing pre-programmed recovery procedures further comprising initiating an automatic transfer of one or more to be processed wafers that have been removed from the cassette and of which the start of the processing is prohibited.

63. The method of claim 62 wherein the step of initiating an automatic transfer of one or more to be processed wafers that have been removed from the cassette and of which the start of the processing is prohibited comprises transferring the one or more to be processed wafers to the cassette.

64. The method of claim 53 wherein the step of providing pre-programmed recovery procedures further comprises initiating a hold unload timer during which no automated response to the inhibit next load flag is started.

65. The method of claim 64 wherein the step of initiating a hold unload timer further comprises allowing operator intervention when the hold unload timer is operational.

66. A process tool for the processing of one or more wafers comprising:
at least one reactor chamber for processing one or more wafers;
a system controller having a processor and memory and operable to execute a process control system program and to monitor and control processing tool parameters; and
a wafer inspection station coupled to the processing tool and coupled to the system controller, the wafer inspection station operable to examine a wafer previously processed in the reaction chamber, the wafer inspection station to generate wafer data and send the wafer data to the system controller; and
wherein the system controller is operable to compare the wafer data against predefined limits and set a confirmation flag in a "true" state when the wafer data are within the predefined limits and set or leave the confirmation flag in a "false" state when the wafer data are outside the predefined limits and to prohibit the start of the processing of the one or more to be processed wafers when the confirmation flag is in a false state.

67. The process tool of claim 66, wherein the system controller is operable to set an inhibit next load flag on predefined inputs the inhibit next load flag not effecting already started processing and, when the inhibit next load flag is set prior to the start of subjecting the wafer in the reaction chamber to a process, to prohibit the start of processing, and to provide pre-programmed recovery procedures so that after execution of a pre-programmed recovery procedure the one or more to be processed wafers ends in a defined state such that the tool can be used for further processing.

68. The process tool of claim 66, wherein the system controller comprises one or more subcontrollers, connected to the system controller, the one or more sub-controllers performing part of the tasks of the tool controller.

69. The process tool of claim 67 wherein providing pre-programmed recovery procedures includes the step of providing operator selectable recovery procedures.

70. The process tool of claim 69 wherein providing operator selectable recovery procedures includes resetting the inhibit next load flag if the predetermined condition is no longer true.

71. The process tool of claim 69 wherein providing operator selectable recovery procedures includes overruling the inhibit next load flag for the immediate next to be processed wafer.

72. The process tool of claim 67 wherein the predefined condition is based on an alarm level of a real time parameter, the real time parameter representing real time conditions in the process tool.

73. The process tool of claim 67 wherein the predefined condition is based on an expression comprising one or more parameters out of a collection of a plurality of real time parameters, representing real time conditions in the process tool, and analysis results of a wafer processed prior to the to be processed wafer.

74. The process tool of claim 67 wherein the predefined condition is a "set inhibit next load flag" command, initiated by an operator command.

75. The process tool of claim 67 wherein the predefined condition is a "set inhibit next load flag" command, initiated by a higher level controller, connected to the tool controller.

76. The process tool of claim 67 wherein the one or more to be processed wafers are supplied to the process tool in cassettes and pre-programmed recovery procedures further comprising initiating an automatic transfer of the one or more to be processed wafers that have been removed from the cassette and of which the start of the processing is prohibited.

77. The process tool of claim 76 wherein an automatic transfer of the one or more to be processed wafers that have been removed from the cassette and of which the start of the processing is prohibited comprises transferring the one or more to be processed wafers to the cassette.

78. The process tool of claim 67 wherein the pre-programmed recovery procedures further comprises initiating a hold unload timer during which no automated response to the inhibit next load flag is started.

79. The process tool of claim 78 wherein initiating the hold unload timer further comprises allowing operator intervention when the hold unload timer is operational.

* * * * *

UNITED STATES PATENT AND TRADEMARK OFFICE
CERTIFICATE OF CORRECTION

PATENT NO. : 6,732,006 B2
DATED : May 4, 2004
INVENTOR(S) : Haanstra et al.

It is certified that error appears in the above-identified patent and that said Letters Patent is hereby corrected as shown below:

<u>Title page,</u>
Item [75], Inventors, should read:

-- Kornelius Haanstra, Nijeveen (NL);
Marinus Jan van de Pol, Tiel (NL);
Jan Zinger, Dwingelo (NL) --

Signed and Sealed this

Twenty-seventh Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,732,006 B2
DATED         : May 4, 2004
INVENTOR(S)   : Haanstra et al.

It is certified that error appears in the above-identified patent and that said Letters Patent is hereby corrected as shown below:

<u>Title page,</u>
Item [75], Inventors, should read:

-- Kornelius Haanstra, Nijeveen (NL);
Marinus Jan van der Pol, Tiel (NL);
Jan Zinger, Dwingelo (NL) --

This certificate supersedes Certificate of Correction issued July 27, 2004.

Signed and Sealed this

Sixteenth Day of November, 2004

JON W. DUDAS
*Director of the United States Patent and Trademark Office*